United States Patent [19]

Mizushima et al.

[11] Patent Number: 5,747,859
[45] Date of Patent: May 5, 1998

[54] MAGNETIC DEVICE AND MAGNETIC SENSOR USING THE SAME

[75] Inventors: Koichi Mizushima, Kamakura; Teruyuki Kinno, Kawasaki; Takashi Yamauchi; Koichiro Inomata, both of Yokohama, all of Japan

[73] Assignee: Kabushiki Kaisha Toshiba, Kawasaki, Japan

[21] Appl. No.: 699,326

[22] Filed: Aug. 19, 1996

[30] Foreign Application Priority Data

Sep. 1, 1995 [JP] Japan .................. 7-225625
Jul. 18, 1996 [JP] Japan .................. 8-189366

[51] Int. Cl.⁶ .................. H01L 29/82; H01L 29/84; G11B 5/127; G11B 5/33
[52] U.S. Cl. .................. 257/421; 257/427; 360/113
[58] Field of Search .................. 257/30, 421, 427, 257/425, 536; 360/113; 324/252

[56] References Cited

U.S. PATENT DOCUMENTS

| | | | |
|---|---|---|---|
| 3,972,035 | 7/1976 | Holtzberg et al. | 257/30 |
| 4,823,177 | 4/1989 | Prinz et al. | 257/421 |
| 5,416,353 | 5/1995 | Kamiguchi et al. | 257/421 |
| 5,636,093 | 6/1997 | Gijs et al. | 360/113 |
| 5,640,343 | 6/1997 | Gallagher et al. | 365/171 |

OTHER PUBLICATIONS

D.J. Monsma, et al., "Perpendicular Hot Electron Spin-Valve Effect in a New Magnetic Field Sensor: The Spin-Valve Transistor", Physical Review Letters, vol. 74, No. 26, Jun. 16, 1995, pp. 5260-5263.

Primary Examiner—Tom Thomas
Assistant Examiner—Adriana Giordana
Attorney, Agent, or Firm—Oblon, Spivak, McClelland, Maier & Neustadt, P.C.

[57] ABSTRACT

A magnetic sensor has a three-terminal magnetic device consisting of an emitter, a base, and a collector. A semiconductor layer serving as the collector and a magnetic multilayered film serving as the base form a Schottky junction. The magnetic multilayered film has two magnetic films opposing each other with a nonmagnetic film between them. The emitter constructed of a metal film and the base are connected via a tunnel insulating film. The relationship between the magnetization directions in the magnetic films changes in accordance with an external magnetic field, and this changes the value of a current flowing through the magnetic device. The external magnetic field is sensed on the basis of this change in the current value.

6 Claims, 10 Drawing Sheets

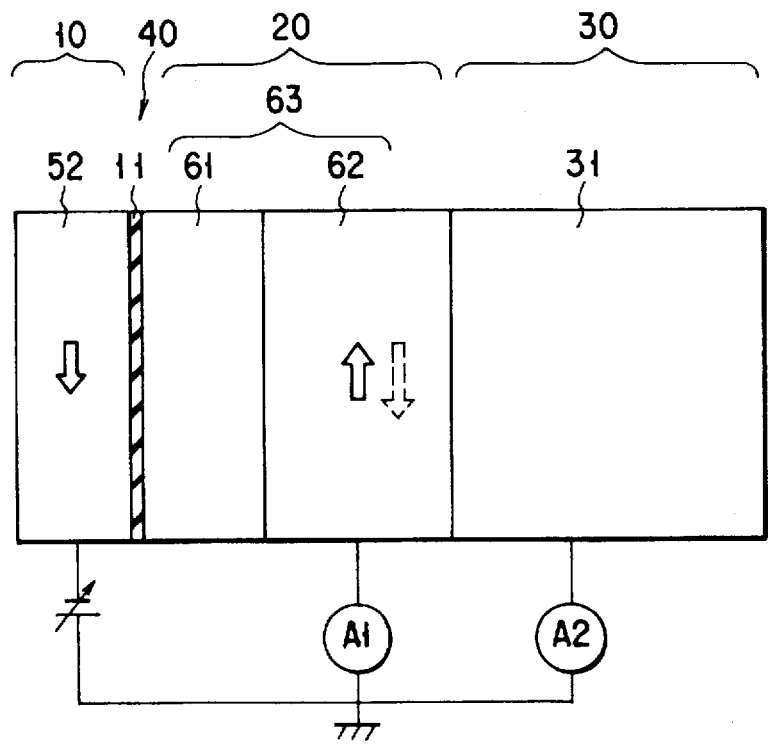
F I G. 14
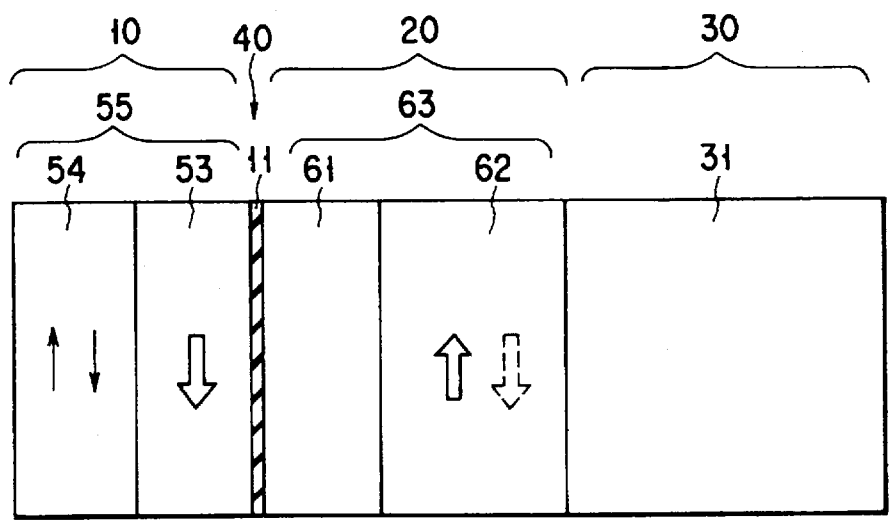
F I G. 15

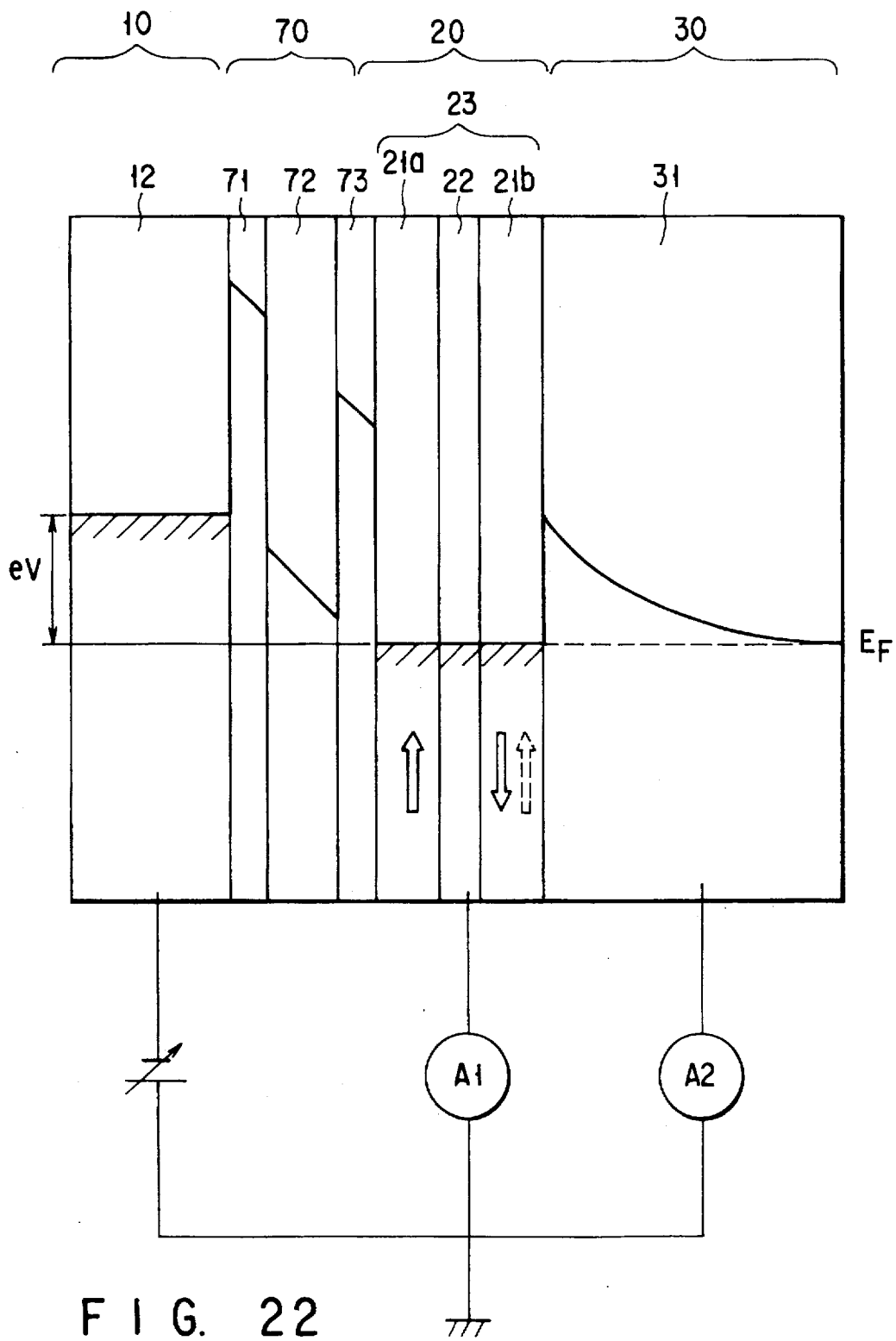
F I G. 22

MAGNETIC DEVICE AND MAGNETIC SENSOR USING THE SAME

BACKGROUND OF THE INVENTION

1. Field of the Invention

The present invention relates to a magnetic device used as, e.g., a magnetic field sensing device for sensing a very weak magnetic field in a very small region, and a magnetic sensor using the same.

2. Description of the Related Art

Increases in the density and speed of magnetic recording largely depend upon the improvement of magnetic recording media and the progress of magnetic recording apparatuses, particularly the progress of magnetic heads for performing write and read operations in magnetic recording. For example, with the decreasing sizes and the increasing capacities of the recent magnetic recording media, a relative speed between a magnetic recording medium and a read magnetic head is decreased. Accordingly, as a new type of a read magnetic head capable of extracting a high output even at a low relative speed, a magnetic head called a magnetoresistance effect head (to be referred to as an MR head hereinafter), particularly a giant magnetoresistance effect head (to be referred to as a GMR head hereinafter) has drawn attention. The GMR head uses a large magnetoresistance effect of a multilayered film consisting of a magnetic material and a nonmagnetic material. Various kinds of the GMR heads have been proposed, and a GMR head of type called a spin valve head is considered to be promising among them all.

This spin valve GMR head has a basic structure in which a ferromagnetic layer, a nonmagnetic layer, and a ferromagnetic layer are stacked on an antiferromagnetic layer. The direction of magnetization in the lower ferromagnetic layer is spatially fixed by an exchange interaction acting between this ferromagnetic layer and the antiferromagnetic layer. The magnetization in the upper ferromagnetic layer weakly interacts with the magnetization in the lower ferromagnetic layer through the nonmagnetic layer. However, the upper ferromagnetic layer can be antiferromagnetically coupled with the lower ferromagnetic layer by properly selecting the thickness of the nonmagnetic layer. That is, when an external magnetic field is zero, the magnetization in the upper ferromagnetic layer couples with the magnetization in the lower ferromagnetic layer in opposite directions. Since this antiferromagnetic magnetic coupling is weak, the direction of the magnetization in the upper ferromagnetic layer is readily reversed if an external magnetic field is applied to the direction of the magnetization in the lower ferromagnetic layer. That is, under an external magnetic field, the directions of magnetization in the upper and the lower ferromagnetic layers are the same.

It is known that the electric resistance of a multilayered film consisting of a ferromagnetic layer/nonmagnetic layer/ferromagnetic layer structure depends upon the relative magnetization direction in the upper and the lower ferromagnetic layers. This is so because in a magnetic material the scattering of conduction electrons depends upon the spin magnetic moments of the electrons. Since the relative magnetization direction in the multilayered film described above depends upon an external magnetic field, the electric resistance of the film strongly depends upon the external magnetic field. This phenomenon is called a giant magnetoresistance effect. The spin valve GMR head uses this giant magnetoresistance effect and reads out magnetically recorded data.

Although the magnetic head using the giant magnetoresistance effect has excellent characteristics, it also has several drawbacks. The main cause of these drawbacks is that the multilayered film having the giant magnetoresistance effect is a metal multilayered film with a low electric resistance, and so it is necessary to increase the density of a current made to flow through the multilayered film in order to obtain a sufficient output voltage. When the density of a current made to flow through the device is thus increased, the device generates heat, electromigration occurs, or a magnetic field is generated by the current, thereby making the device operation unstable.

A larger magnetoresistance effect is expected when a current is made to flow vertically in the multilayered film. However, since the absolute value of the resistance is very small in this direction, no practical device can be obtained from the present GMR head structure.

As described above, in the conventional magnetic heads using the magnetoresistance effect, the density of a current made to flow through the multilayered film must be increased to obtain a sufficient output voltage. When the current density is thus increased, the device generates heat, electromigration occurs, or a magnetic field is generated. It is therefore necessary to eliminate these problems. Also, a magnetic head structure is demanded in which a sufficient output voltage can be obtained with a low current density even when a current is made to flow vertically in the multilayered film, in which case a larger magnetoresistance effect can be expected.

SUMMARY OF THE INVENTION

The present invention has been made in consideration of the above situation, and has as its object to provide a magnetic device which operates well with a low current density and has a high sensitivity, and a magnetic sensor using the same.

A magnetic device according to a first aspect of the present invention comprises:
- a multilayered film including first and second magnetic films and a nonmagnetic film interposed between the first and second magnetic films;
- an electron collecting section including a semiconductor layer connected to one surface of the multilayered film via a Schottky junction; and
- an electron injecting section including a metal film connected to the other surface of the multilayered film via a tunnel junction member.

A magnetic device according to a second aspect of the present invention comprises:
- a multilayered film having a first magnetic film and a nonmagnetic film;
- an electron collecting section including a semiconductor layer connected to the first magnetic film via a Schottky junction; and
- an electron injecting section including a second magnetic film connected to the nonmagnetic film via a tunnel junction member.

A magnetic device according to a third aspect of the present invention is a device according to the first or second aspect, wherein the first and second magnetic films are so set as to have different coercive forces.

A magnetic device according to a fourth aspect of the present invention is a device according to any one of the first to third aspects, wherein the tunnel junction member comprises a resonant tunnel structure including first and second barrier layers and a quantum well layer interposed between the first and second barrier layers.

A magnetic device according to a fifth aspect of the present invention comprises:

a tunnel junction member having a resonant tunnel structure including first and second barrier layers and a quantum well layer interposed between the first and second barrier layers and consisting of a first magnetic film;

an electron collecting section connected to one surface of the tunnel junction member; and an electron injecting section connected to the other surface of the tunnel junction member, the electron injecting section including a second magnetic film having a coercive force lower than a coercive force of the first magnetic film.

A magnetic device according to a sixth aspect of the present invention is a device according to the fifth aspect, wherein the electron collecting section includes a semiconductor layer connected to the tunnel junction member via a Schottky junction.

A magnetic device according to a seventh aspect of the present invention is a device according to the sixth aspect, wherein the tunnel junction member includes a third magnetic film which forms the Schottky junction together with the semiconductor layer, and the third magnetic film has substantially the same coercive force as the coercive force of the second magnetic film.

A magnetic device according to an eighth aspect of the present invention is a device according to the fifth aspect, wherein the electron collecting section includes a third magnetic film, and the third magnetic film has substantially the same coercive force as the coercive force of the second magnetic film.

A magnetic sensor according to a ninth aspect of the present invention comprises:

a magnetic device according to any one of the first to eighth aspects;

a power supply for applying a voltage to the electron injecting section; and means for detecting a current flowing out from the electron collecting section, wherein when a relationship between magnetization directions in the first and second magnetic films is changed by an external magnetic field, the current flowing out from the electron collecting section changes accordingly, and the external magnetic field is sensed on the basis of the change in the current.

The magnetic device of the present invention uses the spin scattering of electrons vertically flowing through the magnetic film or the multilayered film consisting of the magnetic film and the nonmagnetic film. Accordingly, a high sensitivity can be obtained in principle. Also, an applied voltage is supported by a tunnel junction or a Schottky junction, and a Schottky barrier has a high junction resistance. Therefore, an appropriate current value can be easily obtained under a desired bias voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 14 is a view conceptually showing a magnetic device according to still another embodiment of the present invention;

FIG. 15 is a view conceptually showing a magnetic device according to still another embodiment of the present invention;

FIG. 22 is a view conceptually showing a magnetic device according to still another embodiment of the present invention, in which a resonant tunnel junction member is used in the magnetic device shown in FIG. 5;

DETAILED DESCRIPTION OF THE
PREFERRED EMBODIMENTS

The principle of a magnetic device and a magnetic sensor using the same according to the present invention will be described below with reference to FIGS. 1A to 4.

Figure 1A:
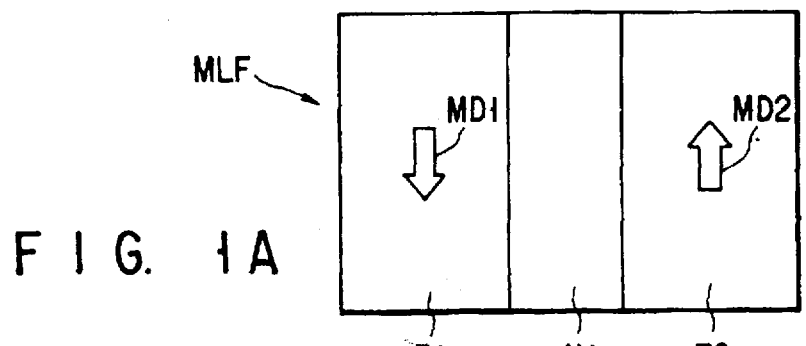
FIGS. 1A to 1C are views for explaining the principle of a magnetic device and a magnetic sensor using the device according to the present invention.
Figures 1B, 1C:
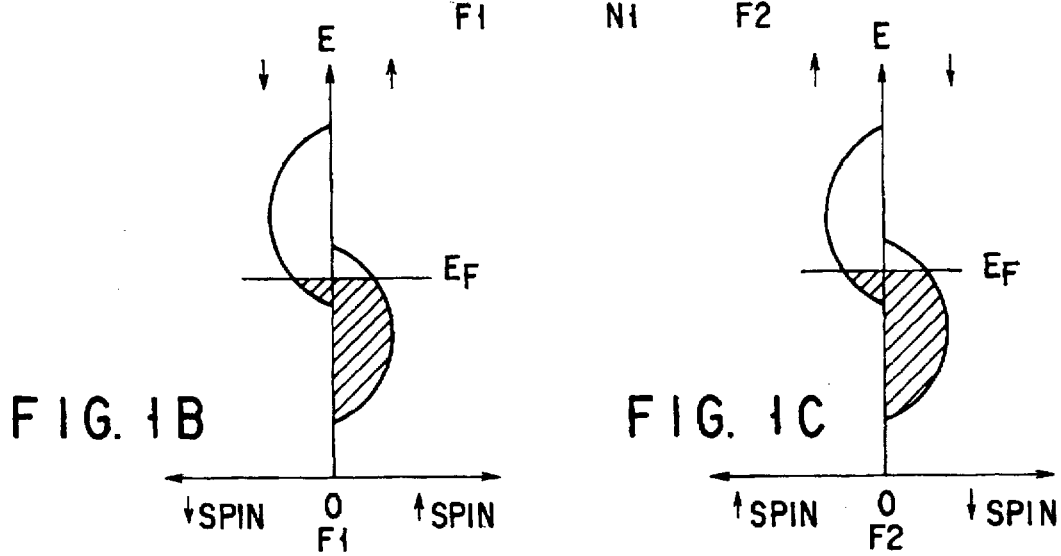

In a magnetic material, a state density of electrons splits between an up-spin band and a down-spin band. For example, as shown in FIG. 1A, assume that in a multilayered film MLF consisting of a magnetic film F1, a nonmagnetic film N1, and a magnetic film F2, magnetization directions MD1 and MD2 in the magnetic films F1 and F2 are opposite to each other. In this structure, as shown in FIGS. 1B and 1C, the state densities of electrons in the magnetic films F1 and F2 have opposite characteristics for up-spin electrons (indicated by upward arrows) and down-spin electrons (indicated by downward arrows).

Figure 2A:
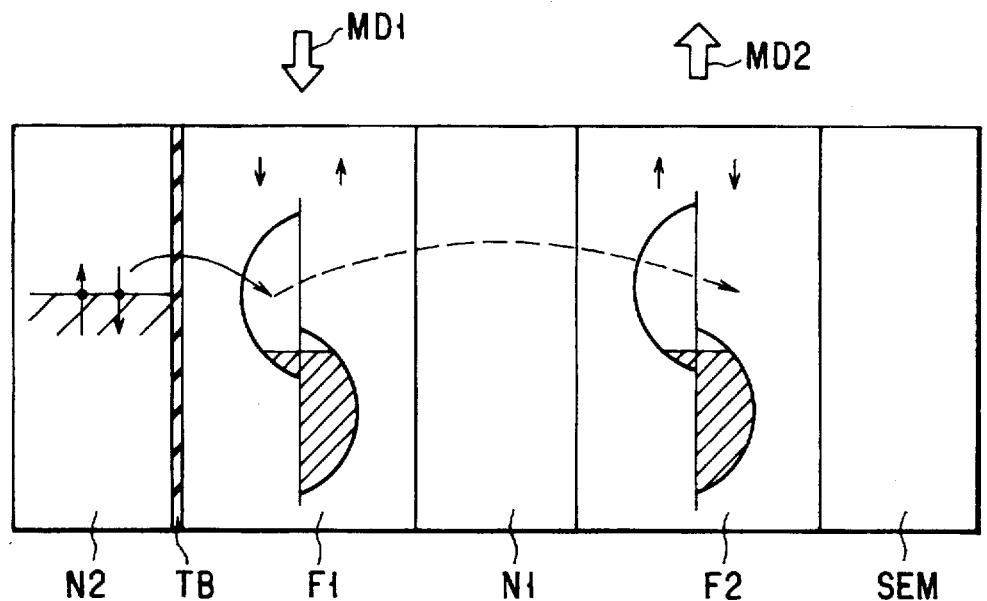
FIGS. 2A and 2B are views showing a device in which a nonmagnetic film is connected via a tunnel barrier and a semiconductor film is connected via a Schottky junction, to the multilayered film shown in FIG. 1A.

FIG. 2A shows a device in which a nonmagnetic film N2 is connected to the magnetic film F1 of the multilayered film MLF via a tunnel barrier TB and a semiconductor film SEM made of, e.g., silicon, forms a Schottky junction with the magnetic film F2. In this device, when a voltage is applied between the nonmagnetic film N2 and the multilayered film MLF so that the nonmagnetic film N2 becomes negative, the nonmagnetic film N2 generates electrons (hot electrons) having energy EN higher than a Fermi level $E_F$ of the magnetic films F1 and F2.

Assume, as shown in FIG. 2A, that the magnetization directions MD1 and MD2 in the magnetic films F1 and F2 remain opposite (antiparallel) to each other. If this is the case, the state density of electrons in the magnetic film F1 at the energy EN is high for the down-spin electrons and substantially zero for the up-spin electrons. As a consequence, only the down-spin electrons move from the nonmagnetic film N2 and reach the magnetic film F1 through the tunnel barrier TB. However, the state density of electrons in the magnetic film F2 at the energy EN is substantially zero for the down-spin electrons. Accordingly, the down-spin electrons passing through the tunnel barrier TB are reflected by the magnetic film F2, i.e., they cannot move from the magnetic film F1 to the magnetic film F2.

Figure 2B:
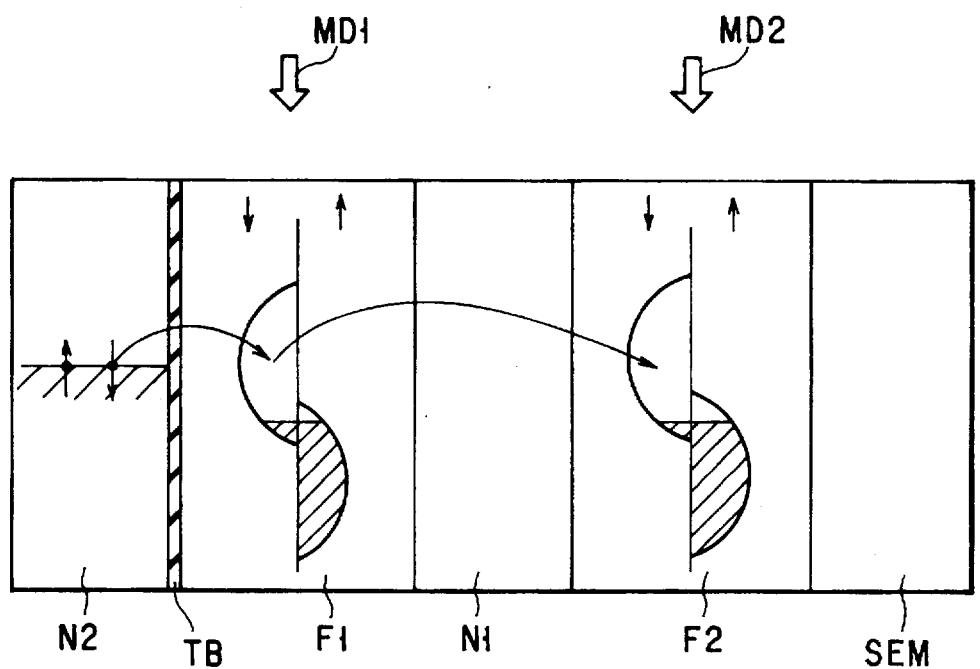

Assume, as illustrated in FIG. 2B, that the magnetization direction in the magnetic film F2 is changed by an external magnetic field and consequently the magnetization directions MD1 and MD2 in the magnetic films F1 and F2 become the same (parallel). In this case, the state densities of electrons in both the magnetic films F1 and F2 at the energy EN are high for the down-spin electrons and substantially zero for the up-spin electrons. Consequently, only the down-spin electrons move from the nonmagnetic film N2 to the magnetic film F2 through the tunnel barrier TB and the magnetic film F1 without being reflected.

When the applied voltage between the nonmagnetic film N2 and the multilayered film MLF exceeds the height of the Schottky barrier between the magnetic film F2 and the semiconductor film SEM, some down-spin electrons reaching the magnetic film F2 flow into the semiconductor film SEM. The electrons once flowing into the semiconductor film SEM cannot return to the multilayered film MLF due to a junction electric field, loosing the energy in the semiconductor film SEM and forming a collector current.

Figure 3:
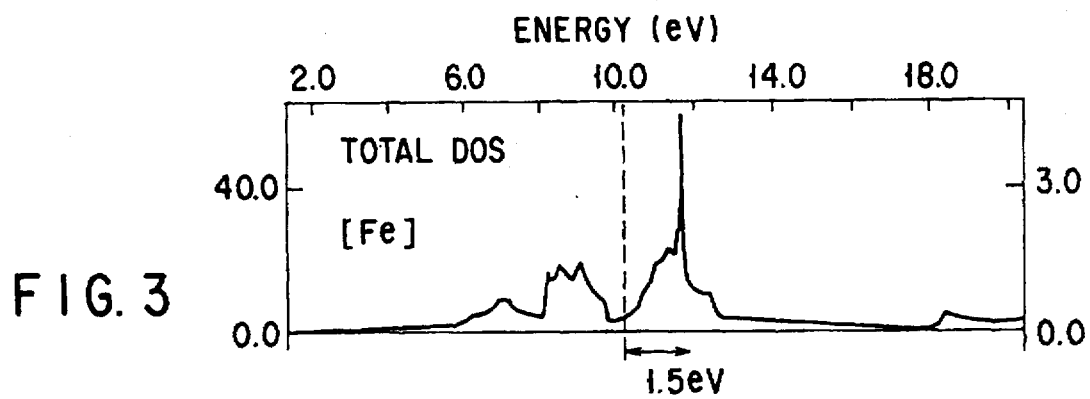
FIG. 3 is a graph showing the state density of electrons in Fe.
Figure 4:
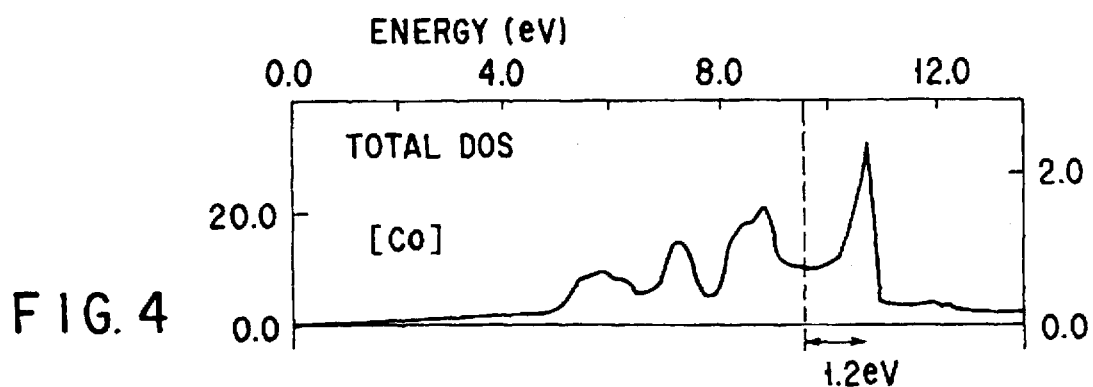
FIG. 4 is a graph showing the state density of electrons in Co.

When the nonmagnetic film N2 serving as an electron injecting source and the multilayered film MLF are connected via a tunnel junction, the energy of injected electrons (hot electrons) can be freely changed. For example, as shown in FIGS. 3 and 4, the state densities of electrons of Fe and Co as representative ferromagnetic substances have sharp peaks higher by approximately 1.5 eV and approximately 1.2 eV, respectively, than the respective Fermi levels. Therefore, by the use of a tunnel junction, it is possible to selectively inject, from the nonmagnetic film N2, electrons with a specific energy meeting the peak of the state density of electrons in the magnetic film F1 or F2. The result is a higher sensitivity than when, e.g., electrons are injected via a Schottky junction.

Figure 5:
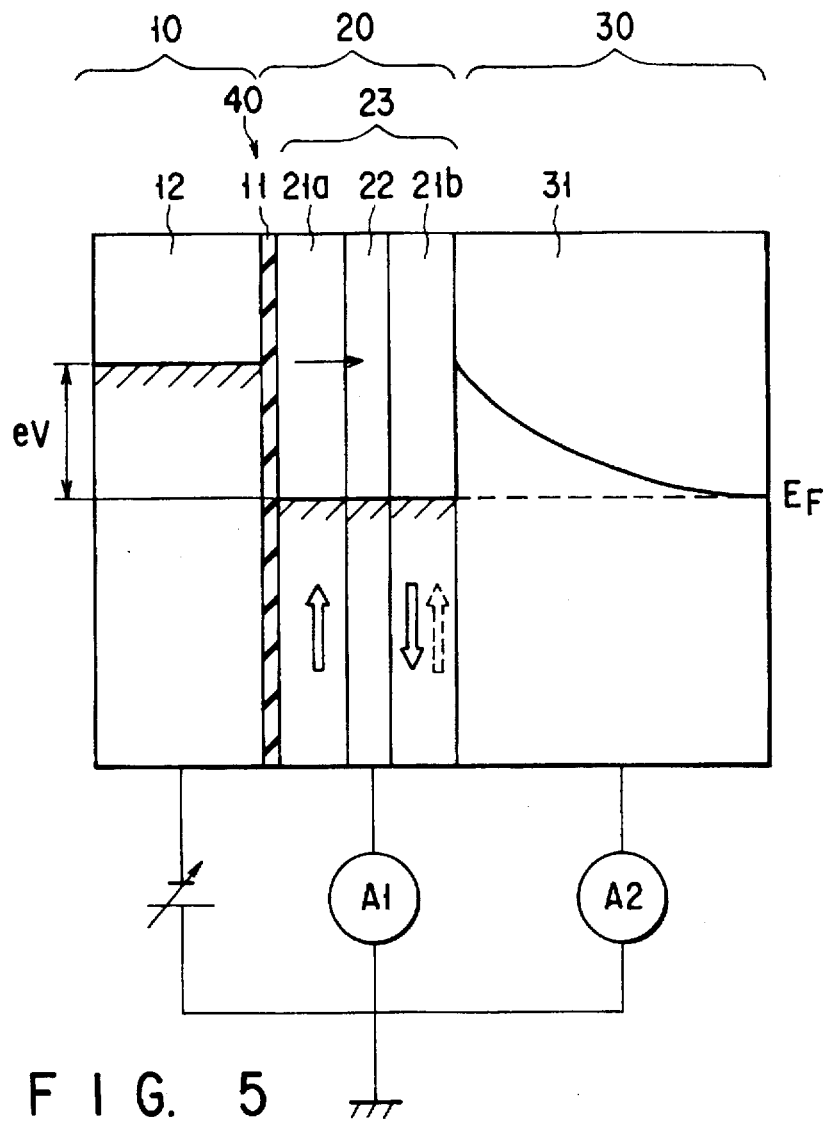
FIG. 5 is a view conceptually showing a magnetic device according to an embodiment of the present invention.

FIG. 5 is a view conceptually showing a magnetic device according to an embodiment of the present invention.

The magnetic device shown in FIG. 5 is a three-terminal device different from a common two-terminal device using a magnetoresistance effect. This device has an emitter (electron injecting section) 10, a base 20, and a collector (electron collecting section) 30. The base 20 is constructed of a multilayered film (to be referred to as a magnetic multilayered film hereinafter) 23 consisting of a magnetic film 21a, a nonmagnetic film 22, and a magnetic film 21b. The emitter 10 is constructed of a nonmagnetic metal film 12 connected to the magnetic multilayered film 23 in the base 20 via a tunnel junction member 40. The emitter 20 injects electrons into the base 20 through the tunnel junction. The tunnel junction member 40 is made of a tunnel insulating film 11. The collector 30 is made of a semiconductor layer 31 which forms a Schottky junction together with the magnetic multilayered film 23 in the base 20. That is, on the semiconductor layer 31 serving as the collector 30, the magnetic multilayered film 23 which forms a Schottky junction together with the semiconductor layer 31 is formed. This magnetic multilayered film 23 constitutes the base 20.

In the magnetic multilayered film 23 forming the base 20, ferromagnetic films such as Co films, CoFe films, or NiFe films are used as the magnetic films 21a and 21b. A nonmagnetic metal film such as a Cu film or an Ag film is used as the nonmagnetic film 22. That is, the magnetic multilayered film 23 is a three-layered film, known as a spin valve film, consisting of a Co/Cu(Ag)/Co or CoFe/Cu(Ag)/CoFe structure.

The magnetic multilayered film 23 is not limited to the three-layered structure described above. For example, a magnetic scattering effect can be enhanced by the use of a multilayered film formed by alternately stacking large numbers of the magnetic films 21a and 21b and the nonmagnetic films 22. It is also possible to add another metal film to one or both sides of the magnetic multilayered film 23 in order to improve the Schottky characteristic or the tunnel characteristic. A semiconductor film or a tunnel insulating film can also be formed between the magnetic films 21a and 21b.

Furthermore, the coercive forces of the magnetic films 21a and 21b can be so set as to be different from each other in order that the magnetization direction in one of the magnetic films 21a and 21b is fixed and only the magnetization direction in the other is changed by an external magnetic field. The coercive forces of the magnetic films 21a and 21b can be made different by fixing the magnetization direction in one of the magnetic films 21a and 21b by forming an antiferromagnetic film adjacent to the film. That is, setting the coercive forces of the magnetic films involves setting them by using an exchange interaction between one magnetic film and an adjacent film such as an antiferromagnetic film.

The tunnel insulating film 11 constituting the tunnel junction member 40 is formed on the base 20 constructed of the magnetic multilayered film 23. The nonmagnetic metal film 12 serving as the emitter 10 is formed via this tunnel insulating film 11. The base 20 constructed of the magnetic multilayered film 23 and the emitter 10 constructed of the nonmagnetic metal film 12 form a tunnel junction via the tunnel insulating film 11. Hot electrons are injected from the emitter 10 into the base 20 through this tunnel junction.

Figure 6:
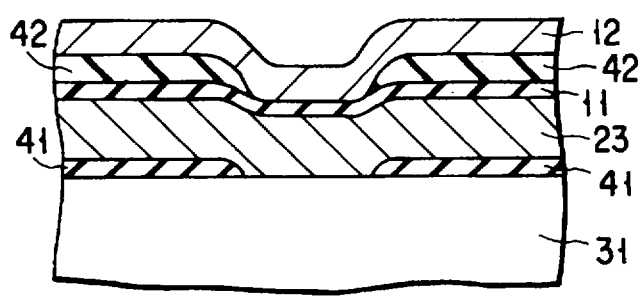
FIG. 6 is a sectional view showing a practical structure of the magnetic device shown in FIG. 5.

The magnetic device described above has, for example, a practical device structure as shown in FIG. 6. That is, on the semiconductor layer 31 serving as the collector, the magnetic multilayered film 23 consisting of the magnetic film, the nonmagnetic film, and the magnetic film is formed as the base. The semiconductor layer as the collector and the magnetic multilayered film 23 as the base, except for a device region, are insulated by an insulating interlayer 41. The semiconductor layer 31 and the magnetic multilayered film 23 can stably form a Schottky junction by interposing a gold layer (not shown). Stabler Schottky characteristics can be expected when a metal silicide layer such as an $NiSi_2$ layer or a $CoSi_2$ layer is interposed instead of the gold layer.

The tunnel insulating film 11 made of, e.g., an aluminum oxide film, is formed on the magnetic multilayered film 23 as the base. The nonmagnetic metal film 12 such as an aluminum film is formed as the emitter via the tunnel insulating film 11. To improve the tunnel characteristics between the emitter and the base, it is preferable to previously form an aluminum film on the magnetic multilayered film 23 as the base, thereby forming a multilayered structure of, e.g., Al/AlOx/Al. The magnetic multilayered film 23 as the base and the nonmagnetic metal film 12 as the emitter, except a device region, are insulated by an insulating interlayer 42.

As shown in FIG. 5, the magnetic device of this embodiment is used as, e.g., a magnetic sensor, by connecting a DC power supply E to the emitter 10 and first and second ammeters A1 and A2 to the base 20 and the collector 30, respectively. The first ammeter A1 can be connected to either the magnetic film or the nonmagnetic film of the magnetic multilayered film 23 as the base.

In the above magnetic device, when a voltage V is applied between the base and the emitter from the DC power supply E, hot electrons are injected from the emitter 10 into the base 20. If the thickness of the base 20 is much smaller than the inelastic scattering length of an electron, these hot electrons reach the base/collector interface without loosing energy. If the injection voltage is lower than the height of the Schottky barrier between the base and the collector, the hot electrons cannot enter the collector 30. The hot electrons flow out from the base 20, and the current value is read by the first ammeter A1.

If the injection voltage exceeds the height of the Schottky barrier, some hot electrons flow into the collector 30. These hot electrons once flowing into the collector 30 cannot return to the base 20 due to the junction electric field. The hot electrons lose energy in the collector 30 and flow out from the collector 30 through the second ammeter A2.

When the base 20 is formed by the magnetic multilayered film 23 as described above, the probability that hot electrons injected into the base 20 reach the base/collector interface strongly depends upon the directions of magnetization in the two magnetic films 21a and 21b constituting the magnetic multilayered film 23. That is, if the magnetization directions in the two magnetic films 21a and 21b are the same, the hot electrons can reach the collector 30 without being influenced by spin scattering. However, if the magnetization directions in the two magnetic films 21a and 21b are opposite, most of the hot electrons cannot reach the collector 30 under the influence of strong spin scattering and flow out from the base 20 through the first ammeter A1. This phenomenon can be explained by using a theory analogous to the theory of a common giant magnetoresistance effect pertaining to conduction electrons described earlier with reference to FIGS. 1A to 2B.

As in the case of common spin valve, the directions of magnetization in the two magnetic films 21a and 21b of the magnetic multilayered film 23 can be controlled by properly selecting the thickness of the nonmagnetic film 22, such that the magnetization directions are antiparallel to each other when an external magnetic field is zero and parallel to each other in the presence of an external magnetic field. When the external magnetic field is zero, therefore, most of the hot electrons injected into the base 20 cannot reach the collector portion 30 and flow out from the base 20 through the first ammeter A1. When the external magnetic field is applied, the hot electrons injected into the base 20 flow out primarily from the collector 30 through the second ammeter A2. In the present invention, however, while the antiferromagnetic film described above is formed, it is also possible to control the magnetization directions in the two magnetic films 21a and 21b such that the directions are parallel or antiparallel to each other when the external magnetic field is zero.

When n-type silicon, for example, is used as the semiconductor layer 31 constituting the collector 30, the height of the Schottky barrier formed between the semiconductor and a common metal is about 0.5 to 1.0 V. Accordingly, when the device is operated with a bias voltage of 1 V or higher applied between the base and the emitter, the collector current is modulated by the external magnetic field. That is, the device can be functioned as a magnetic sensor by measuring the collector current with the second ammeter A2. This magnetic sensor can be used as a read magnetic head of a magnetic recording apparatus.

In principle, the collector current can be modulated by the external magnetic field even when a tunnel junction is formed, instead of the Schottky barrier, between the base 20 and the collector 30 by using, e.g., a metal film. If the tunnel junction is formed, however, hot electrons reaching the base/collector interface do not flow into the collector 30 easily and there is the possibility that these electrons flow out from the base 20 through the first ammeter A1. To avoid this problem, it is necessary to apply a very high bias voltage. In the present invention, therefore, it is more effective to form a Schottky barrier between the base 20 and the collector 30.

Unlike a common spin valve magnetic head, the above magnetic device uses spin scattering of electrons vertically flowing through the magnetic multilayered film 23. Therefore, a higher sensitivity can be obtained in principle. Additionally, while a spin valve magnetic head uses a magnetoresistance effect, i.e., spin scattering of conduction electrons existing near the Fermi level, the magnetic device of the present invention uses hot electrons whose energy can be freely controlled by a bias voltage and a tunnel junction. Consequently, a larger spin scattering effect can be used.

Figure 7:
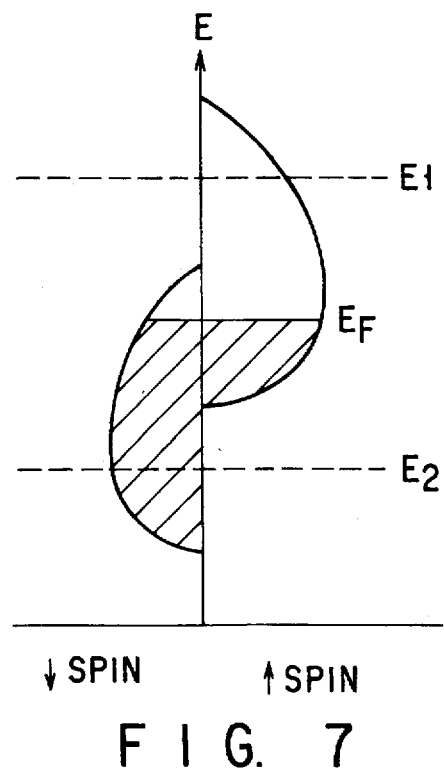
FIG. 7 is a view showing a state density of electrons depending upon spins in a ferromagnetic material.

For example, when the magnetic multilayered film 23 is formed by using a magnetic material having a state density schematically shown in FIG. 7, the state density of an up spin near a Fermi level $E_F$ is several times as high as the state density of a down spin, at most. However, for a hot electron having energy E1 much higher than the Fermi level shown in FIG. 7, the state density of a down spin is almost zero and so an extremely strong spin scattering effect can be expected. This is also true of a hot hole having energy E2.

Furthermore, in the above magnetic device, the applied voltage is supported by the tunnel insulating film 23 between the base and the emitter. Therefore, it is readily possible to obtain an appropriate current value under a desired bias voltage by controlling the thickness of the tunnel insulating film 23. This prevents electromigration, generation of heat, and formation of a magnetic field by a current, which have been problems in the conventional spin valve magnetic heads. Also, the collector 30 behaves as an ideal constant-current source due to a high junction resistance of the Schottky barrier. This allows a very simple circuit to be used as the second ammeter A2. That is, an output can be extracted very easily from this magnetic device.

[Example 1]

An example of practical fabrication of the magnetic device shown in FIGS. 5 and 6 and the characteristics of the device will be described below. A practical device structure is as illustrated in FIG. 6.

An n-type silicon layer doped with $10^{16}$ $cm^3$ of boron was used as a semiconductor layer 31 forming a collector 30, and a magnetic multilayered film 23 of Co/Ag/Co was used as a base 20. In this magnetic multilayered film 23, the thickness of each Co film was 3 nm and the thickness of the Ag film was 2 nm. It was confirmed by magnetization measurements that the directions of magnetization in the two Co films were antiparallel when an external magnetic field was zero and parallel under a magnetic field of 100 G or more.

A Schottky junction between the base and the collector was formed by removing a natural oxide film from the surface of the n-type silicon layer by using hydrofluoric acid and interposing a 3-nm thick Au film. This Au layer was interposed to form a good Schottky junction with a small leak. An ohmic contact to a collector terminal was formed by forming an AuSb alloy by vacuum evaporation and heating the alloy.

A 20-nm thick aluminum film was used as a nonmagnetic metal film 12 as an emitter 10, and a 1.5-nm thick aluminum oxide film was used as a tunnel insulating film 11. By interposing a 3-nm thick aluminum film near the base, a tunnel junction consisting of Al/AlOx/Al was formed between the emitter and the base. A silicon thermal oxide film was used as an insulating interlayer 41 between the collector and the base, and SiO was used as an insulating interlayer 42 between the base and the emitter.

Figure 8:
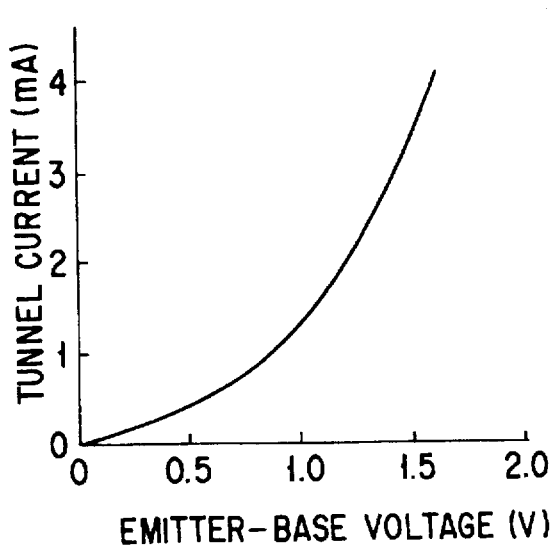
FIG. 8 is a graph showing the tunnel characteristic between the emitter and the base of a magnetic device of Example 1.
Figure 10:
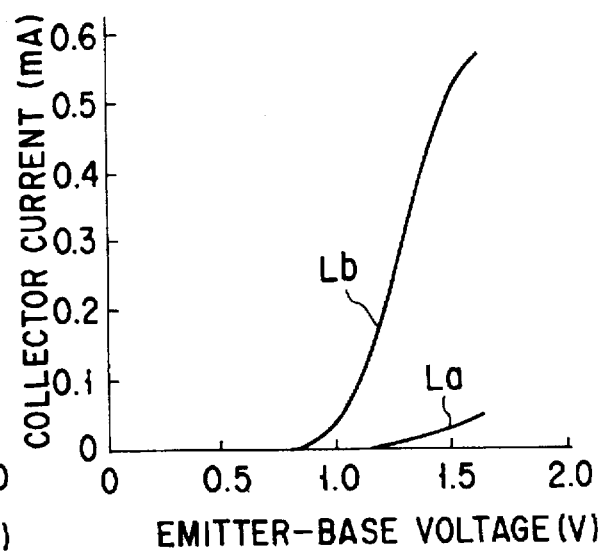
FIG. 10 is a graph showing the emitter-base voltage dependence of a collector current in the magnetic device of Example 1.
Figure 9:
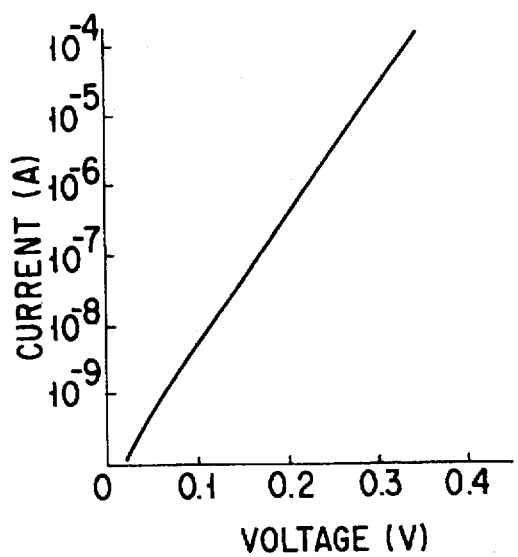
FIG. 9 is a graph showing the Schottky characteristic between the base and the collector of the magnetic device of Example 1.

FIG. 8 shows the tunnel characteristic between the emitter and the base of the above magnetic device, and FIG. 9 shows the Schottky characteristic between the base and the collector of the device. FIG. 10 shows the result when a collector current IC was measured while a voltage V between the emitter and the base was increased. In FIG. 10, a line La indicates the result when an external magnetic field was zero, and a line Lb indicates the result when a magnetic field of 100 G was applied parallel to the magnetic multilayered film 23.

Figure 11:
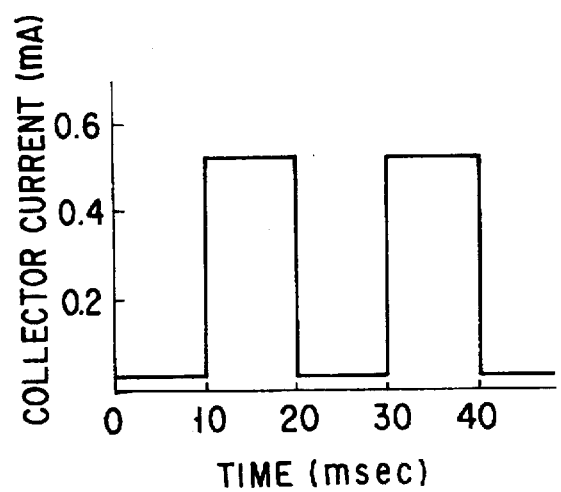
FIG. 11 is a graph showing the magnetic field response of the collector current in the magnetic device of Example 1.

As indicated by the line La in FIG. 10, when an external magnetic field was zero, the collector current IC was very small and most of the electrons injected into the emitter 10 flowed out from the base 20 without reaching the collector 30. When an external magnetic field was applied, as indicated by the line Lb, the collector current IC started flowing when a bias voltage exceeded the voltage of a Schottky barrier (up to 0.8 V). A magnetic field of 100 G was turned on and off while the voltage between the emitter and the base was fixed at 1.5 V. The result was that, as shown in FIG. 11, a large modulation of the collector current IC was observed, i.e., the magnetic device was found to function as a magnetic sensor.

Figure 12:
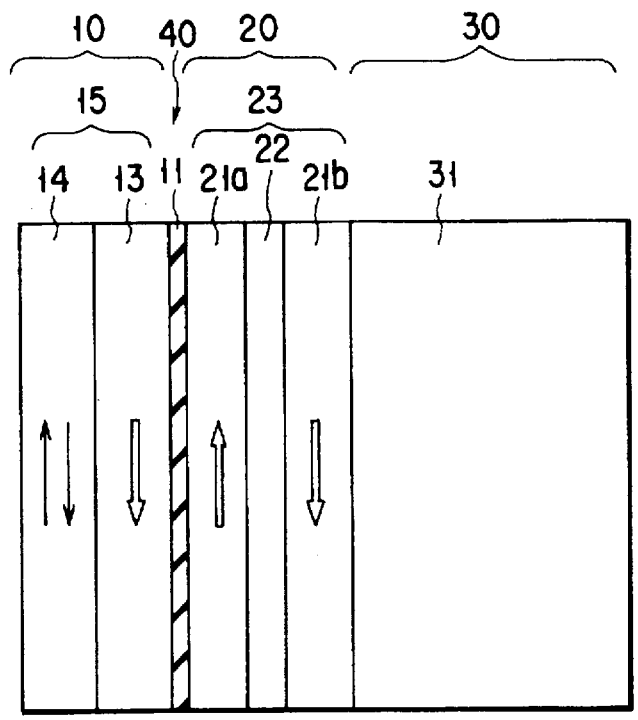
FIG. 12 is a view conceptually showing a magnetic device according to another embodiment of the present invention.

FIG. 12 is a view conceptually showing the structure of a magnetic device according to another embodiment of the present invention. The magnetic device in FIG. 12 uses a multilayered film 15 consisting of a ferromagnetic film 13 and an antiferromagnetic film 14 as an emitter 10. In the magnetic device with this structure, the direction of magnetization in the ferromagnetic film 13 in the emitter is fixed by the exchange interaction between the ferromagnetic film 13 and the antiferromagnetic film 14. Accordingly, the direction of spins of hot electrons injected from the emitter 10 into a base 20 is held constant. Consequently, the magnitude of a tunnel current flowing from the emitter 10 into the base 20 changes in accordance with the magnetization directions in magnetic films 21a and 21b of a magnetic multilayered film 23. With this structure, it is possible to improve the external magnetic field sensing characteristics.

The magnetic device with the structure shown in FIG. 12 can also be realized by forming the emitter 10 by using a single-layer ferromagnetic film with a large coercive force, instead of the multilayered film 15 consisting of the ferromagnetic film 13 and the antiferromagnetic film 14. Furthermore, in the magnetic device with the above structure, the magnetic multilayered film 23 in the base 20 can be replaced with a single-layer magnetic film as will be described later. Even in this structure, the presence/absence of an external magnetic field can be well sensed. In this structure, a tunnel junction can also be formed by using a semiconductor film in place of the tunnel insulating film 11.

It was found by experiments analogous to those in Example 1 that the magnetic device shown in FIG. 12 functioned as a magnetic sensor.

Figure 13:
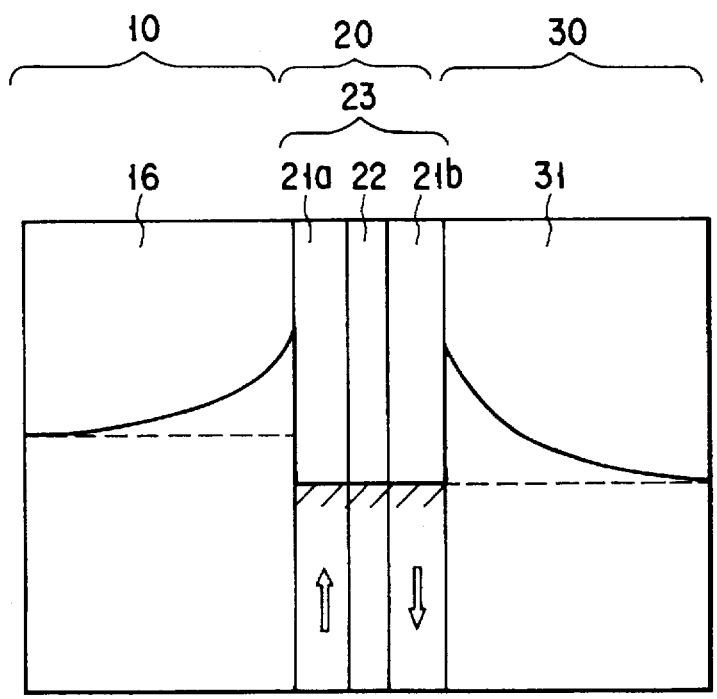
FIG. 13 is a view conceptually showing a magnetic device according to still another embodiment of the present invention.

FIG. 13 is a view conceptually showing the structure of a magnetic device according to still another embodiment of the present invention.

In the magnetic device shown in FIG. 13, a semiconductor layer 16 similar to a collector 30 is used instead of the metal film formed via a tunnel junction to constitute the emitter 10 in the magnetic device in FIG. 5. That is, an emitter 10 and a base 20 form a second Schottky junction. This magnetic device has a bipolar transistor structure using a metal as the base.

In the magnetic device shown in FIG. 13, injection of electrons from the emitter 10 to the base 20 is done by a thermal process via the Schottky junction, rather than a tunnel process. The rest of the principle is identical with that of the magnetic device shown in FIG. 5. In the magnetic device with this structure, as in the magnetic device in FIG. 5, a high sensitivity can be obtained and an appropriate current value can be readily obtained under a desired bias voltage. This prevents electromigration, generation of heat, and formation of a magnetic field by a current, which have been problems in the conventional spin valve magnetic heads.

In this device in which the emitter 10 is formed by the Schottky junction, however, in comparison with the magnetic device shown in FIG. 5, the injection voltage cannot be sufficiently raised and so the collector current tends to decrease compared to the injection current. This is so because the transmittance of a hot electron in the base/collector interface greatly depends upon its energy. Also, it is necessary to well control the film formation conditions, the film structures, and the like in order to well form the two Schottky junctions. In view of these respects, therefore, a more preferred embodiment of the present invention is a magnetic device in which electrons are injected through a tunnel junction as described above.

In the magnetic device shown in FIG. 13, it is also possible to excite spin-polarized electrons by irradiating polarized light onto the semiconductor layer 16 as the emitter 10 and inject the excited electrons as hot electrons into the base 20. In the device with this structure, a direct transition type semiconductor represented by a compound semiconductor such as GaAs, GaAlAs, CdSe, or CdTe or a caracopalite semiconductor such as $CdSiAs_2$ is used as the semiconductor layer 16. When circularly polarized light is irradiated onto such a direct transition type semiconductor, spin-polarized electrons having a polarity based on the direction of polarization of the circularly polarized light are excited. This semiconductor in which spin-polarized electrons are thus excited can function as the emitter 10 for injecting spin-polarized electrons, like the emitter 10 using the ferromagnetic film in the magnetic device shown in FIG. 12. Accordingly, this structure has an advantage in that the external magnetic field sensing characteristics are improved as in the case of the magnetic device in FIG. 12. In this structure, as in the above structure, the magnetic multilayered film 23 in the base 20 can be replaced with a single-layer magnetic film.

It was found by experiments similar to those in Example 1 that the magnetic device shown in FIG. 13 functioned as a magnetic sensor.

FIG. 14 is a view conceptually showing the structure of a magnetic device according to still another embodiment of the present invention.

A base 20 of this device is made of a multilayered film 63 consisting of a nonmagnetic film 61 and a magnetic film 62. An emitter 10 is made of a magnetic film 52 connected to the nonmagnetic film 61 of the base 20 via a tunnel junction member 40. The emitter 20 injects hot electrons into the base 20 through the tunnel junction. The tunnel junction member 40 is constructed of a tunnel insulating film 11. A collector (electron collecting section) 30 is constructed of a semiconductor layer 31 which forms a Schottky junction together with the magnetic film 62 of the base 20.

A magnetic material which is very strong, i.e., has a high coercive force, is used as the material of the magnetic film 52, and thereby the magnetization direction in the film is fixed. On the other hand, the magnetic film 62 has a low coercive force and so the magnetization direction in the film can be reversed by an external magnetic field. Consequently, the passage of electrons can be controlled as in the device shown in FIG. 5. The same effect can be obtained by lowering the coercive force of the magnetic film 52 and raising the coercive force in the magnetic film 62 so that only the magnetization direction in the magnetic film 52 can be reversed.

Figure 18:
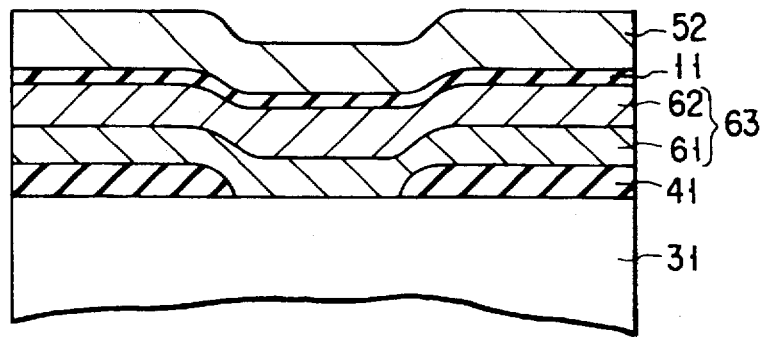
FIG. 18 is a sectional view showing a practical structure of the magnetic device shown in FIG. 14.

The magnetic device shown in FIG. 14 has, for example, a practical device structure as shown in FIG. 18. That is, on the semiconductor layer 31 serving as the collector, the multilayered film 63 consisting of the nonmagnetic film 61 and the magnetic film 62 is formed as the base. The semiconductor layer 31 as the collector and the multilayered film 63 as the base, except for a device region, are insulated by an insulating interlayer 41. On the multilayered film 63 as the base, the tunnel insulating film 11 constituting the tunnel junction member 40 is formed. The magnetic film 52 serving as the emitter (electron injecting section) is formed via this tunnel insulating film 11.

The semiconductor layer 31 and the multilayered film 63 can be stably Schottky-junctioned by interposing a gold layer (not shown). Stabler Schottky characteristics can be expected by interposing a metal silicide layer such as an $NiSi_2$ or $CoSi_2$ layer instead of the gold layer.

The magnetic device shown in FIG. 14 can be used as, e.g., a magnetic sensor, by connecting a DC power supply E to the emitter 10 and first and second ammeters A1 and A2 to the base 20 and the collector 30, respectively. The first ammeter A1 can be connected to either the magnetic film or the nonmagnetic film of the magnetic multilayered film 63 as the base. The collector current is modulated when the magnetization direction in the magnetic film 62 is changed by an external magnetic field while a bias voltage higher than the Schottky barrier is applied between the base and the emitter. That is, the device can be function as a magnetic sensor by measuring the collector current with the second ammeter A2. This magnetic sensor can be used as, e.g., a read magnetic head of a magnetic recording apparatus.

In the device shown in FIG. 14, the thickness of the base 20 can be made smaller than in the device shown in FIG. 5, since the number of films in the base 20 is smaller. Also, since the number of interfaces in the base 20 decreases, scattering independent of the direction of a spin decreases. This increases the hot-electron current and consequently the collector current and thereby improves the device characteristics. For these reasons, characteristics superior to those of the device shown in FIG. 5 can be expected from the device shown in FIG. 14.

FIG. 15 is a view conceptually showing the structure of a magnetic device according to still another embodiment of the present invention.

In this device, a multilayered film 55 consisting of a ferromagnetic film 53 and an antiferromagnetic film 54 is used as an emitter 10. The direction of magnetization in the ferromagnetic film 53 in the emitter 10 is fixed by an exchange interaction between the ferromagnetic film 53 and the antiferromagnetic film 54. Accordingly, the direction of spins of hot electrons injected from the emitter 10 into a base 20 is held constant. Consequently, the magnitude of a tunnel current from the emitter 10 to the base 20 changes in accordance with the direction of magnetization in a magnetic film 62 of a multilayered film 63, i.e., in accordance with an external magnetic field. With this structure, it is possible to improve the external magnetic field sensing characteristics.

Figure 16:
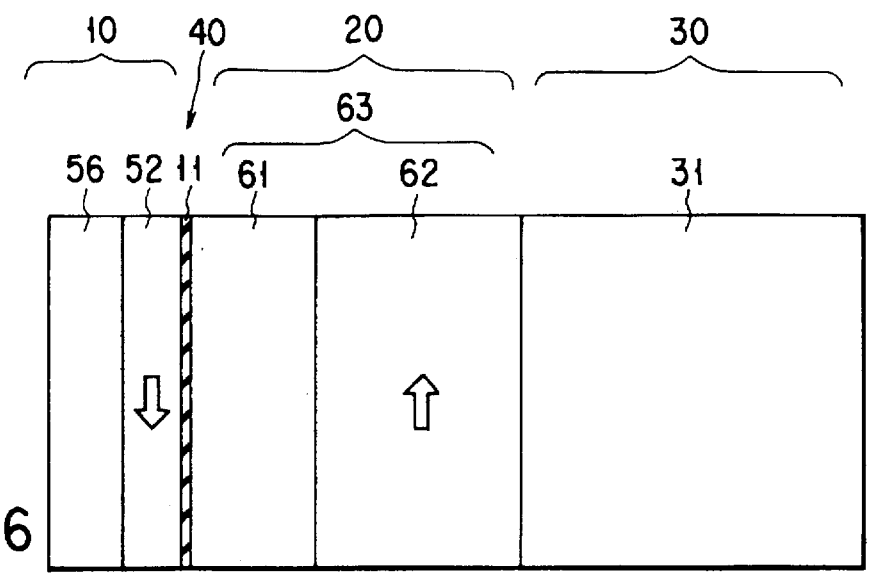
FIG. 16 is a view conceptually showing a magnetic device according to still another embodiment of the present invention.
Figure 17:
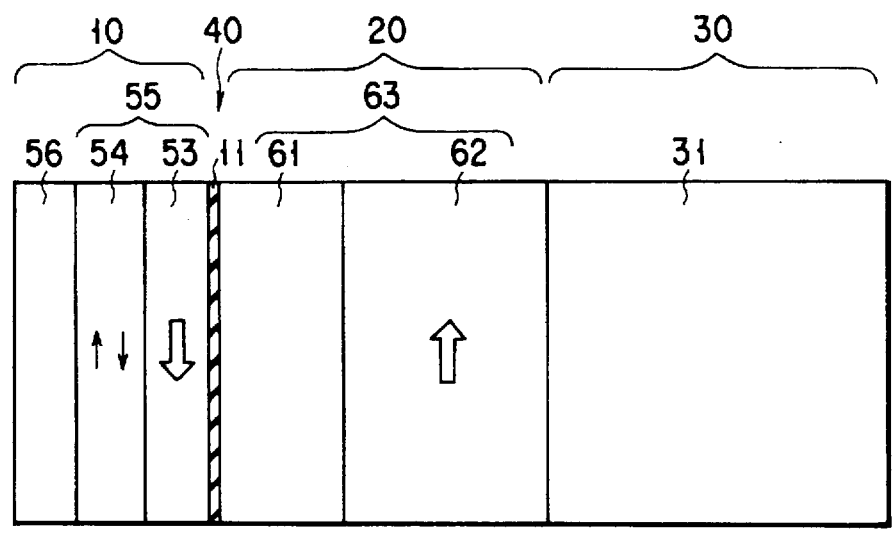
FIG. 17 is a view conceptually showing a magnetic device according to still another embodiment of the present invention.

In the devices shown in FIGS. 14 and 15, a nonmagnetic film 56 can also be stacked in the emitter 10 as shown in FIGS. 16 and 17.

In the embodiments shown in FIGS. 14 to 17, a ferromagnetic film such as an Fe film, a Co film, a CoFe film, or an NiFe film is used as the magnetic films 52, 53, and 62. A nonmagnetic metal film such as an Al film, a Cu film, or an Ag film is used as the nonmagnetic films 56 and 61. As the antiferromagnetic film 54, an FeMn film is used. An example of the tunnel insulating film 11 is an AlOx film. An example of the semiconductor layer 31 is an Si Substrate.

[EXAMPLE 2]

An example of practical fabrication of the magnetic devices shown in FIGS. 14 and 18 and the characteristics of the devices will be described below. A practical device structure is as shown in FIG. 18.

As in Example 1, an n-type silicon layer doped with $10^{16}/cm^3$ of boron was used as a semiconductor layer 31 forming a collector 30, and a multilayered film 63 consisting of an Al nonmagnetic film 61 and an Fe magnetic film 62 was used as a base 20. The thickness of the Fe magnetic film 62 was 2 nm, and the thickness of the Al nonmagnetic film 61 was 5 nm. A thermal silicon oxide film was used as an insulating interlayer 41 between the collector and the base. A 3-nm thick Au film was interposed between the base and the collector to improve the Schottky junction characteristic.

A magnetic film 52 serving as an emitter 10 and made of a CoFe alloy was stacked on the Al film 61 of the multilayered film 63 via the AlOx tunnel insulating film 11. The AlOx tunnel insulating film 11 was formed by oxidizing the surface of the Al film 61 in an oxygen stream. The CoFe magnetic film 52 was formed by performing sputtering in a magnetic field of 1 tesla, and the magnetization direction was fixed.

Figure 19:
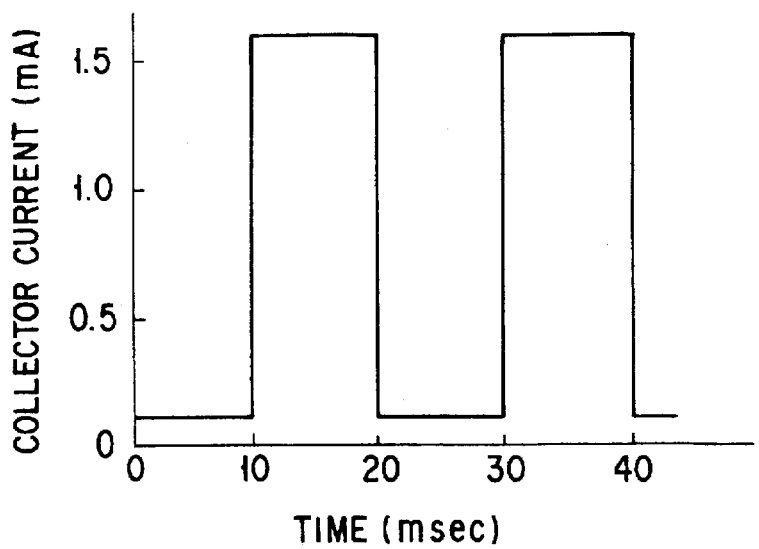
FIG. 19 is a graph showing the magnetic field response of a collector current in a magnetic material device of Example 2.

In the device formed as above, a magnetic field of 100 G was turned on and off at 100 Hz while the voltage between the emitter and the base was fixed to 1.5 V. Consequently, a large degree of modulation of the collector current was observed as shown in FIG. 19. The modulation width was larger than that in the device of Example 1, i.e., better device characteristics were obtained.

It was confirmed by experiments similar to those in Example 2 that each of the magnetic devices shown in FIGS. 15 to 17 functioned as a good magnetic sensor.

An embodiment using a resonant tunnel junction as a tunnel junction member for controlling injection of electrons between an emitter 10 and a base 20 will be described below.

Figure 20:
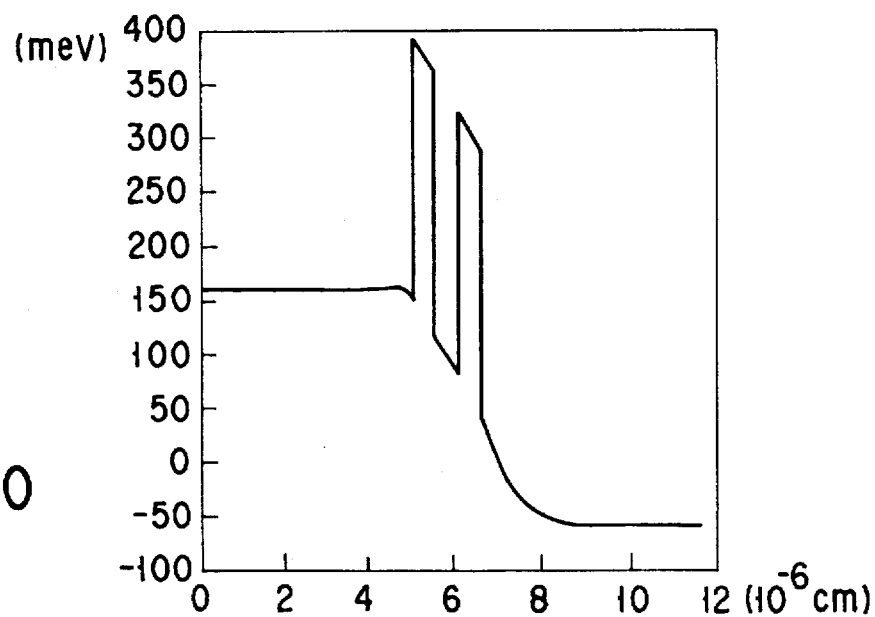
FIG. 20 is a graph showing the energy band of a double barrier resonant tunnel device using a semiconductor heterojunction.

Recently, quantum effect devices have drawn attention and a resonant tunnel device is known as a quantum effect device already found to operate at room temperature (Richard A. Kiehland, T. C. L. Gerhard Sollner, High Speed Heterostructure Devices, Semiconductors and Semimetals 41). As a resonant tunnel diode, many experiments and theoretical calculations have been made for a device using a semiconductor heterojunction as shown in FIG. 20. A resonant tunnel diode with the structure as shown in FIG. 20 is particularly called a double barrier resonant tunnel diode in which an AlGaAs region corresponds to a barrier portion. It is well known that a resonant tunnel phenomenon occurs regardless of the number of barriers.

Figure 21:
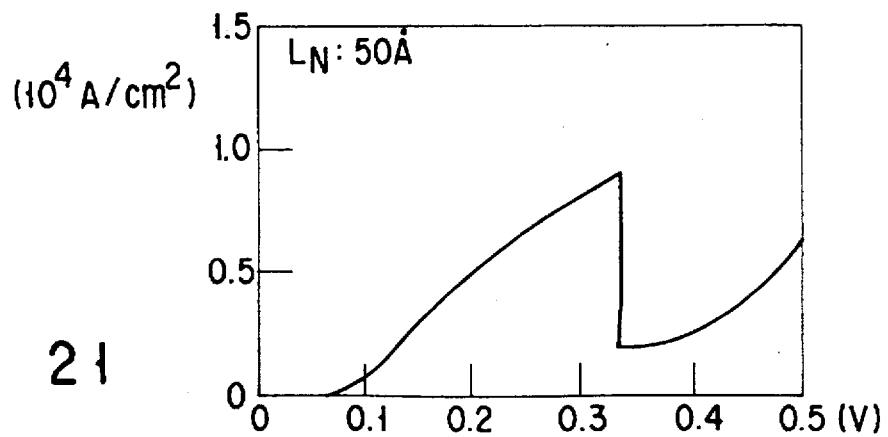
FIG. 21 is a graph showing the current-voltage characteristic of the resonant tunnel device shown in FIG. 20.

FIG. 21 shows a change in the anode current as a function of a change in the cathode voltage (H. Ohnishi et. al., Appl. Phys. Lett. 49 (1986), 1248). FIG. 21 shows that a sharp peak is found at a specific voltage in the current-voltage characteristic. This phenomenon is known as a resonant tunnel phenomenon. This is understood as a phenomenon in which when the resonance level in a region called a quantum well sandwiched between barriers agrees with the Fermi level of the cathode, the tunnel probability of an electron becomes 1and the tunnel resistance of the electron decreases. A resonant tunnel diode shows a negative differential current-voltage characteristic as shown in FIG. 21 and has a very high sensitivity.

When a magnetic field is applied to this double barrier tunnel diode using a semiconductor heterojunction, a Zeeman effect occurs and the resonance level in the quantum well splits in accordance with the spins of electrons. Therefore, the peak position in the current-voltage characteristic changes in accordance with the difference between the states (up or down) of spins of electrons injected from the cathode. By using this phenomenon, the spin state of electrons on the cathode side can be known by measuring the peak position of the anode current.

Although experiments have been primarily made on resonant tunnel devices using a semiconductor heterojunction, the phenomenon is independent of the material, provided that a device has the structure shown in FIG. 20. However, many experiments have been made in semiconductors because the resonant tunnel phenomenon is conspicuously seen when scattering of, e.g., phonons in the quantum well is little and the electron density is low. Therefore, the resonant tunnel phenomenon is also seen in a resonant tunnel diode using a metal/insulator heterojunction or a metal/semiconductor heterojunction. Recently, experiments made on resonant tunnel diodes using these systems are also reported.

The band discontinuity in a metal/insulator, e.g., ($CoSi_2$)/($CaF_2$), heterojunction is as large as 15 eV, 60 times or more larger than 0.25 eV as the band discontinuity in an AlGaAs/GaAs semiconductor heterojunction. A double barrier tunnel diode can be effectuated by using $CaF_2$ and $CoSi_2$ as the barrier and the quantum well, respectively, in the structure shown in FIG. 20. Since the band discontinuity is large, the tunnel probability of electrons injected from the cathode is low. Therefore, it is necessary to decrease the thicknesses of the barrier and the quantum well layer. However, the resonant tunnel phenomenon can be expected when the barrier layer is 0.9 nm and the quantum well layer is 1.9 nm.

Also, unlike a semiconductor heterojunction, for a metal/insulator heterojunction, there is a technique of controlling a layer of several molecules, and so a resonant tunnel diode of this sort can be realized. In effect, a triple barrier resonant tunnel diode using this $CaF_2$/$CoSi_2$ heterojunction was found to have a negative differential resistance characteristic at room temperature (T. Suemasu et. al., Electron Lett. 28, 1432 (1992)). A resonant tunnel diode using a metal/semiconductor, e.g., (NiAl)/(AlAs), heterojunction was also found to have a negative differential resistance characteristic (N. Tabatabaie et. al., Appl. Phys. Lett., 53, 2528 (1988)).

For the reasons explained above, another metal/insulator heterojunction can be realized. For example, a metal/insulator, e.g., (Fe)/($Al_2O_3$), heterojunction can be formed by using Fe as a metal, growing Al on Fe, and oxidizing Al. This heterojunction has a band discontinuity of about 15 eV. A resonant tunnel diode can be realized by controlling the film thickness of this heterojunction to be substantially equal to the film thickness of a $CaF_2$/$CoSi_2$ heterojunction.

Furthermore, when a ferromagnetic substance such as Fe is thus used as a quantum well, a molecular field produces an energy level difference of about 1 eV between up-spin electrons and down-spin electrons. Consequently, the resonance level in the quantum well splits in accordance with whether electrons are up-spin electrons or down-spin electrons. Accordingly, the peak position in the current-voltage characteristic changes in accordance with the spin state of electrons injected from the cathode. Consequently, the spin state of electrons on the cathode side can be known.

Unlike a semiconductor heterojunction resonant tunnel diode, in a resonant tunnel diode using such a ferromagnetic substance, the spin state of electrons in the cathode can be known without externally applying any high magnetic field. It is also possible to use an Fe/ZnSe heterojunction as a metal/semiconductor heterojunction. Furthermore, a semimetal such as graphite can be used in the barrier portion. In particular, graphite facilitates formation of the barrier portion since graphite has no vertical state to the surface and hence behaves like an insulator and at the same time allows an easy control of each molecular layer.

A resonant tunnel junction can be used as the tunnel junction member in any of the embodiments described with reference to FIGS. 1A to 19. As an example, FIG. 22 conceptually shows a structure using the resonant tunnel junction in the magnetic device shown in FIG. 5. The same reference numerals as in FIG. 5 denote the same parts in FIG. 22 and a detailed description thereof will be omitted unless it is necessary.

This magnetic device has an emitter (electron injecting section) 10, a base 20, and a collector (electron collecting section) 30. A double barrier resonant tunnel diode is used as a tunnel junction member 70 between the emitter and the base. The tunnel junction member 70 consists of a semiconductor barrier layer 71 as one barrier positioned near the emitter 10, a semiconductor quantum well layer 72 equivalent to a quantum well, and a semiconductor barrier layer 73 as the other barrier near the base 20. As the resonant tunnel diode used in the tunnel junction member 70, the metal/insulator heterojunction or the metal/semiconductor resonant tunnel diode described above can also be used in place of the semiconductor heterojunction resonant tunnel diode. Also, instead of the double barrier resonant tunnel diode, a triple barrier resonant tunnel diode or a resonant tunnel diode having a barrier of higher order can be used.

In the tunnel junction member 70, the resonance level of the resonant tunnel diode must be higher than the height of the Schottky barrier between the base and the collector. This resonance level can be appropriately set by properly selecting the material of the resonant tunnel diode and the thickness of the quantum well. Also, to improve the sensitivity of the collector current to the injection voltage of the resonant tunnel device, the height of the barrier between the base and the collector can be adjusted by inverting the voltage between the base and the collector.

In the magnetic device shown in FIG. 22, the resonant tunnel device is used in the tunnel junction member 70. This resonant tunnel device insulates a metal film 12 in the emitter 10 from a magnetic multilayered film 23 in the base 20 and allows injection of hot electrons into the magnetic multilayered film 23 with a tunnel probability of 1 with respect to an emitter voltage comparable to the peak voltage. That is, the energy of hot electrons injected from the emitter is chosen by the tunnel probability, and this makes injection of electrons with a narrow energy width feasible. Since, therefore, this selects the energy of electrons to be injected, the smaller the energy width of electrons to be injected, the higher the expected sensitivity, when a magnetic material having a state density as shown in FIG. 7 is taken into consideration. Furthermore, the line width of the resonance level is decreased when a material such as a metal/insulator heterojunction resonant tunnel diode having a large band discontinuity is used. Accordingly, in this case, a magnetoresistance effect with a higher sensitivity can be expected.

The absolute value of a current density can be adjusted by adjusting the magnitude of the current density by interposing a thin insulating film between the metal film 12 in the emitter 10 and the tunnel junction member 70. The absolute value of the current density can also be adjusted by adjusting the thickness of the barrier of the resonant tunnel diode in the tunnel junction member 70.

[EXAMPLE 3]

In a structure shown in FIG. 20, $10^{16}$ cm$^{-3}$ doped n-type silicon was used as a semiconductor layer 31 in a collector 30. A magnetic multilayered film 23 in a base 20 has a Co/Ag/Co structure in which the thicknesses of the Co layer and the Ag layer were 3 nm and 20 nm, respectively. A 20-nm thick Al nonmagnetic metal film was used in an emitter 10. This magnetic multilayered structure is also known as a GMR structure.

The height of the Schottky barrier between the n-type silicon in the collector 30 and the magnetic multilayered film 23 was about 0.8 eV. When a voltage of 0.8 V or higher was applied between the emitter and the base, the collector current abruptly rose. When the emitter/base voltage was set to 3 V and the input current from the emitter to the base was set to 2 mA by adjusting a tunnel junction member 70, the collector current was very low (0.2 mA or less) due to spin scattering in a zero magnetic field. When a magnetic field of 100 G or higher was applied, spins in the magnetic film in the multilayered film 23 were pointed in the same direction, and a collector current of 1.2 mA could be extracted.

As the tunnel junction member 70, a double barrier resonant tunnel transistor having an $Al_2O_3$ layer 71/Fe layer 72/$Al_2O_3$ layer 73 heterojunction was used. When the thickness of each of the $Al_2O_3$ layers 71 and 73 as barriers was 0.5 nm and the thickness of the Fe ferromagnetic layer 73 as a quantum well was 3 nm, a current of 10 mA was obtained with 1.7 V at room temperature.

[EXAMPLE 4]

A structure show in FIG. 22 was formed under the same conditions as in Example 3 except for a tunnel junction member 70. As the tunnel junction member 70, a double barrier resonant tunnel transistor having a $CaF_2$ layer 71/$CoSi_2$ layer 72/$CaF_2$ layer 73 heterojunction was used. When the thickness of each of the $CaF_2$ layers 71 and 73 as barriers was 0.5 nm and the thickness of the $CoSi_2$ ferromagnetic layer 72 as a quantum well was 3 nm, a current of 10 mA was obtained with 1.7 V at room temperature.

Figure 23:
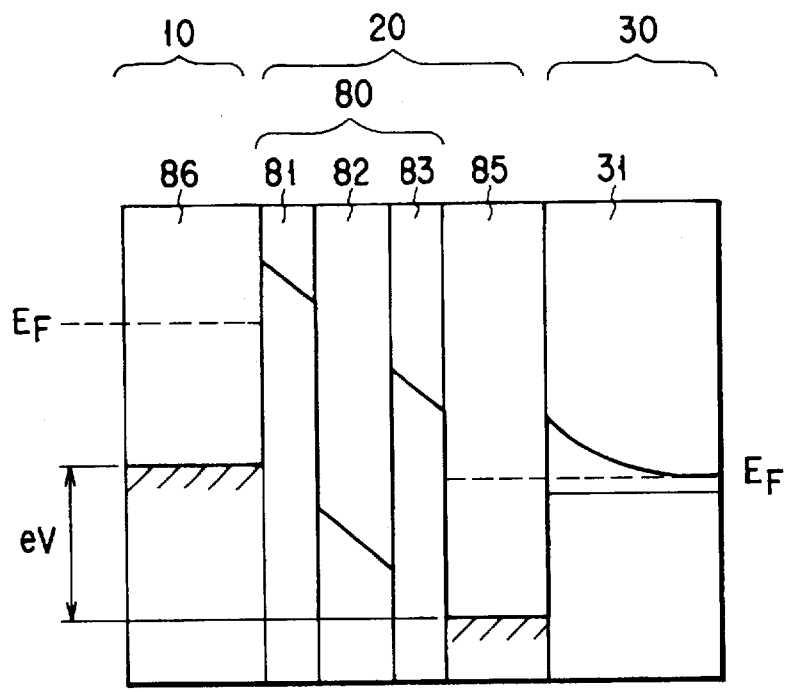
FIG. 23 is a view conceptually showing a magnetic device according to still another embodiment of the present invention.

FIG. 23 is a view conceptually showing a magnetic material device using a resonant tunnel structure according to still another embodiment of the present invention.

In this embodiment, a resonant tunnel multilayered film 80 and a metal film 85 are formed as a base 20 between a metal film 86 as an emitter 10 and a semiconductor layer 81 as a collector 30. The resonant tunnel multilayered film 80 consists of an insulating film 81, a magnetic film 82, and an insulating film 83.

In FIG. 23, the multilayered film 80 constitutes a double barrier resonant tunnel diode. However, this resonant tunnel diode can have any number of layers. Also, the insulating films 81 and 83 can be semiconductor films. The metal film 85 between the multilayered film 80 and the semiconductor layer 31 is a layer for allowing the multilayered film 80 as a resonant tunnel device to stably operate. A base electrode is formed from this layer. A Schottky junction is formed between the metal film 85 and the semiconductor layer 31 as the collector 30. Hot electrons having an energy higher than this Schottky barrier are injected from the metal film 86 as the emitter 10.

When the metal films 85 and 86 are made of the same material, an ideal double barrier tunnel transistor can be formed. The metal films 85 and 86 are formed by using a soft magnetic material (a magnetic material with a low coercive force) 89 such as soft iron so as to be readily magnetized with a weak magnetic field. Consequently, the metal film 86 in the emitter 10 is uniformly magnetized in the same direction by a slight magnetic field output from a recording medium, and electrons injected from the emitter are spun in a fixed direction. The magnetic film 82 in the multilayered film 80 is made of a hard magnetic material (a magnetic material with a high coercive force) such as a CoFe alloy so that the direction of magnetization does not change easily due to an external magnetic field. If the thickness of the multilayered film 80 as a double barrier tunnel diode is much smaller than the inelastic scattering length, electrons can reach the collector 30 without loosing the state of spins which the electrons took in the metal film 86.

When n-type silicon is used as the semiconductor layer 31 in the collector 30, the height of the Schottky barrier formed between this silicon and a common metal is approximately 0.5 to 1.0 eV. Therefore, a voltage of 1 V or higher exceeding this height is applied between the emitter and the base to inject electrons. If the voltage between the emitter and the base is 3 V or higher, the inelastic scattering length abruptly shortens and this requires the size of the device structure to be decreased. To hold an inelastic scattering length of about 10 nm, therefore, control is so performed that a resonant tunnel phenomenon occurs with an emitter-base voltage of about 1 to 3 V. This is readily accomplished by adjusting the material and the width of the quantum well. Furthermore, to improve the sensitivity of the collector current to the injection voltage of the resonant tunnel device, the barrier between the base and the collector can be adjusted by inverting the base-collector voltage.

Assume, for example, that a magnetic material having a state density as shown in FIG. 7 is used as the quantum well magnetic material 82. In this case, for hot electrons equivalent to energy E1, there is no state density of down-spin electrons in the quantum well, and the resonance level exists only for up-spin electrons. Accordingly, a magnetoresistance effect with a higher sensitivity can be expected by adjusting the thickness of the insulating film 81 in the resonant tunnel device 80 so that the energy E1 is equivalent to the resonance level.

[EXAMPLE 5]

In a structure shown in FIG. 23, a $10^{16}$ cm$^{-3}$ doped n-type silicon was used as a semiconductor 31 in a collector. A base 20 had a multilayered structure of an Al$_2$O$_3$ layer 81, a CoFe layer 82, an Al$_2$O$_3$ layer 83, and an Fe film 85. The thickness of each of the Al$_2$O$_3$ layers 81 and 83 was 0.5 nm, and the thickness of each of the quantum well CoFe layer 82 and the Fe film 85 was 3 nm. Soft iron was used as a metal film 86 in an emitter 10.

When up-spin hot electrons were injected from the emitter 10, a peak current was obtained at 1.7 V. When down-spin hot electrons were injected, the current value was small, not exceeding one-hundredth of the peak current. Consequently, it was possible to discriminate the spin states of electrons in the emitter 10.

The reason for this can be considered that a CoFe alloy has a state density as shown in FIG. 7. That is, in a quantum well consisting of CoFe, for hot electrons exceeding the height of the Schottky barrier between the collector 30 and the metal film 85 in the base 20, the resonance level exists for up-spin electrons and there is no resonance level for down-spin electrons.

[EXAMPLE 6]

A structure shown in FIG. 23 was formed under the same conditions as in Example 5 except for a base 20. The base 20 had a triple barrier resonant tunnel structure consisting of an Al$_2$O$_3$ layer 81, a CoFe layer 82, an Al$_2$O$_3$ layer 83, a CoFe layer 82, an Al$_2$O$_3$ layer 83, and an Fe film 85. The thickness of each of the Al$_2$O$_3$ layers 81 and 83 was 0.5 nm, and the thickness of each of the quantum well CoFe layer 82 and the Fe film 85 was 3 nm.

When up-spin hot electrons were injected from an emitter 10, a peak current was obtained at 1.2 V. When down-spin hot electrons were injected, the current value was small, not exceeding one-hundredth of the peak current. Consequently, it was possible to distinguish between the spin states of electrons in the emitter 10.

Figure 24:
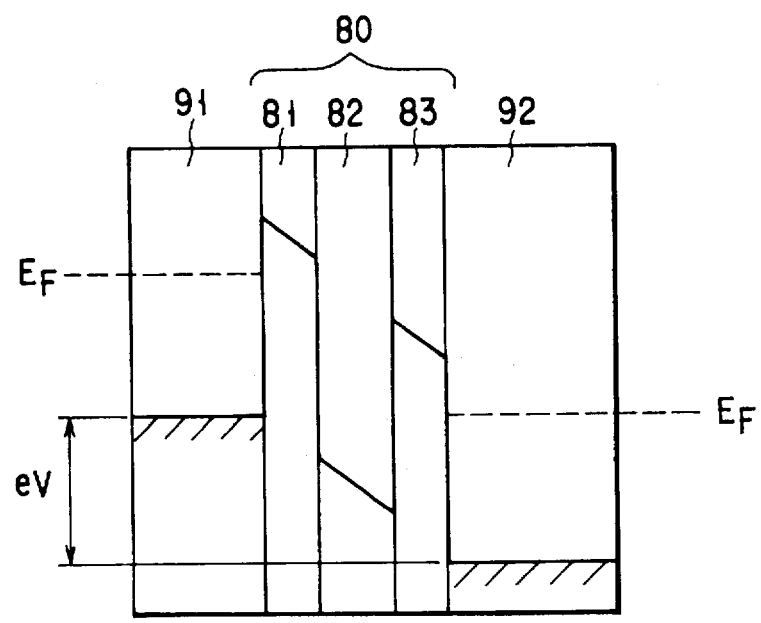
FIG. 24 is a view conceptually showing a magnetic device according to still another embodiment of the present invention.

FIG. 24 is a view conceptually showing a magnetic device using a resonant tunnel structure according to still another embodiment of the present invention.

In this embodiment, a resonant tunnel multilayered film 80 consisting of an insulating film 81, a magnetic film 82, and an insulating film 83 is formed between a metal film 91 serving as a cathode (electron injecting section) for injecting electrons into the multilayered film 80 and a metal film 92 serving as an anode (electron collecting section) into which electrons flow from the multilayered film 80. In FIG. 24, the multilayered film 80 constitutes a double barrier resonant tunnel diode. However, this resonant tunnel diode can have any number of layers.

When the metal films 91 and 92 are made of the same material, an ideal double barrier tunnel transistor can be formed. The metal films 91 and 92 are formed by using a soft magnetic material such as soft iron so as to be readily magnetized with a weak magnetic field. Consequently, the metal film 91 as the cathode is uniformly magnetized in the same direction by a slight magnetic field output from a recording medium, and electrons injected from the emitter are spun in a fixed direction. The magnetic film 82 in the multilayered film 80 is made of a hard magnetic material such as a CoFe alloy so that the direction of magnetization does not change easily due to an external magnetic field. If the thickness of the multilayered film 80 as a double barrier tunnel diode is much smaller than the inelastic scattering length, electrons can reach the collector 30 without loosing the state of spins which the electrons took in the metal film 91.

In a resonant tunnel diode like this, a resonance level split corresponding to a molecular field in the quantum well magnetic film 82 occurs, and a shift of the peak corresponding to the split is produced in the current-voltage characteristic by the spin state. Assume, for example, that a magnetic material having a state density as shown in FIG. 7 is used as the quantum well magnetic film 82. In this case, for hot electrons corresponding to energy E1, there is no state density of down-spin electrons in the quantum well, and a resonance level exists only for up-spin electrons. Therefore, a magnetoresistance effect with a higher sensitivity can be expected when the thickness of the insulating film 81 of the resonant tunnel device 80 is so adjusted that the energy E1 is equivalent to the resonance level.

[EXAMPLE 7]

In a structure shown in FIG. 24, a resonant tunnel multilayered film 80 was formed to have a triple barrier resonant tunnel structure consisting of an Al$_2$O$_3$ layer 81, a CoFe layer 82, an Al$_2$O$_3$ layer 81, a CoFe layer 82, an Al$_2$O$_3$ layer 83, and an Fe layer. The thickness of each of the Al$_2$O$_3$ layers 81 and 83 was 0.5 nm, and the thickness of each of the quantum well CoFe layer 82 and the Fe layer was 3 nm. The thickness of an Fe film 92 in an anode was 3 nm. Soft iron was used as a metal film 91 in a cathode.

When up-spin hot electrons were injected from the cathode, a peak current was obtained at 1.2 V. When down-spin hot electrons were injected, the current value was small, not exceeding one-hundredth of the peak current. Consequently, it was possible to discriminate the spin states of electrons in the cathode.

The reason for this can be considered that a CoFe alloy has a state density as shown in FIG. 7. That is, in a quantum well consisting of CoFe, for hot electrons exceeding the height of the Schottky barrier between a collector 30 and a metal film 85 in a base 20, the resonance level exists for up-spin electrons and there is no resonance level for down-spin electrons.

In the magnetic device of the present invention as has been described above, a high sensitivity can be obtained and stable operating characteristics can be obtained with a low current density, compared to conventional two-terminal devices using a magnetoresistance effect. Also, the magnetic sensor of the present invention using this magnetic device can sense an external magnetic field stably at a high sensitivity.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetic device comprising:

a multilayered film having a first magnetic film and a nonmagnetic film;

an electron collecting section including a semiconductor layer connected to said first magnetic film via a Schottky junction; and an electron injecting section including a second magnetic film connected to said nonmagnetic film via a tunnel junction member.

2. A device according to claim 1, wherein said first and second magnetic films are so set as to have different coercive forces.

3. A device according to claim 1, wherein said tunnel junction member comprises a resonant tunnel structure including first and second barrier layers and a quantum well layer interposed between said first and second barrier layers.

4. A magnetic material sensor comprising:

a multilayered film including a first magnetic film and a nonmagnetic film;

an electron collecting section including a semiconductor layer connected to said first magnetic film via a Schottky junction;

an electron injecting section including a second magnetic film connected to said nonmagnetic film via a tunnel junction member;

a power supply for applying a voltage to said electron injecting section; and means for detecting a current flowing out from said electron collecting section, wherein when a relationship between magnetization directions in said first and second magnetic material films is changed by an external magnetic field, the current flowing out from said electron collecting section changes accordingly, and the external magnetic field is sensed on the basis of the change in the current.

5. A sensor according to claim 4, wherein said first and second magnetic films are so set as to have different coercive forces.

6. A sensor according to claim 4, wherein said tunnel junction member comprises a resonant tunnel structure including first and second barrier layers and a quantum well layer interposed between said first and second barrier layers.

* * * * *